(12) United States Patent
Ali et al.

(10) Patent No.: US 8,350,375 B2
(45) Date of Patent: Jan. 8, 2013

(54) FLIPCHIP BUMP PATTERNS FOR EFFICIENT I-MESH POWER DISTRIBUTION SCHEMES

(75) Inventors: Anwar Ali, San Jose, CA (US); Kalyan Doddapaneni, Milpitas, CA (US); Wilson Leung, San Francisco, CA (US)

(73) Assignee: LSI Logic Corporation, Milpitas, CA (US)

( * ) Notice: Subject to any disclaimer, the term of this patent is extended or adjusted under 35 U.S.C. 154(b) by 70 days.

(21) Appl. No.: 12/121,363

(22) Filed: May 15, 2008

(65) Prior Publication Data

US 2009/0283904 A1    Nov. 19, 2009

(51) Int. Cl.
*H01L 23/52* (2006.01)
*H01L 23/48* (2006.01)
*H01L 29/40* (2006.01)

(52) U.S. Cl. ........ 257/691; 257/737; 257/738; 257/778; 257/E23.021; 257/E23.069

(58) Field of Classification Search ............... 257/673, 257/737, 738, 780, E23.021, E23.069, 691, 257/778
See application file for complete search history.

(56) References Cited

U.S. PATENT DOCUMENTS

| | | | | |
|---|---|---|---|---|
| 3,364,300 A * | 1/1968 | Bradham, III | ............... | 174/254 |
| 4,829,404 A * | 5/1989 | Jensen | ............... | 361/749 |
| 5,731,631 A * | 3/1998 | Yama et al. | ............... | 257/702 |
| 5,885,855 A * | 3/1999 | Liang | ............... | 438/128 |
| 5,952,726 A * | 9/1999 | Liang | ............... | 257/778 |
| 6,078,502 A * | 6/2000 | Rostoker et al. | ............... | 361/723 |
| 6,111,310 A * | 8/2000 | Schultz | ............... | 257/691 |
| 6,278,264 B1 * | 8/2001 | Burstein et al. | ............... | 323/282 |
| 6,346,721 B1 * | 2/2002 | Schultz | ............... | 257/207 |
| 6,437,431 B1 * | 8/2002 | Mbouombouo et al. | ...... | 257/676 |
| 6,483,714 B1 * | 11/2002 | Kabumoto et al. | ........... | 361/760 |
| 6,591,410 B1 * | 7/2003 | Ali et al. | ........................ | 716/12 |
| 6,657,870 B1 * | 12/2003 | Ali et al. | ........................ | 361/760 |
| 6,727,597 B2 * | 4/2004 | Taylor et al. | ................... | 257/786 |
| 6,961,247 B2 * | 11/2005 | Tomsio et al. | ................. | 361/775 |
| 7,081,672 B1 * | 7/2006 | Govind et al. | ................ | 257/724 |
| 7,095,107 B2 * | 8/2006 | Ramakrishnan et al. | ..... | 257/691 |
| 2001/0035746 A1 * | 11/2001 | Burstein et al. | ................ | 323/283 |
| 2002/0159243 A1 * | 10/2002 | Ogawa et al. | ................. | 361/760 |
| 2003/0237059 A1 * | 12/2003 | Schultz | ............................. | 716/4 |
| 2004/0003941 A1 * | 1/2004 | Duxbury et al. | .............. | 174/261 |
| 2004/0251535 A1 * | 12/2004 | Nagata et al. | ................. | 257/691 |
| 2005/0248040 A1 * | 11/2005 | Osburn | ......................... | 257/786 |
| 2007/0094630 A1 * | 4/2007 | Bhooshan | ....................... | 716/13 |
| 2007/0245556 A1 * | 10/2007 | Hosomi et al. | ................. | 29/852 |
| 2008/0173469 A1 * | 7/2008 | Hirakawa | ...................... | 174/255 |
| 2009/0212424 A1 * | 8/2009 | Chen | ............................. | 257/737 |

* cited by examiner

*Primary Examiner* — Teresa M Arroyo
(74) *Attorney, Agent, or Firm* — Clark Hill PLC

(57) ABSTRACT

Disclosed is a flipchip scheme where power and ground bumps are arranged in a striped configuration. Specifically, there are a plurality of lines of power bumps, and a plurality of lines of ground bumps. Each line of power bumps is interconnected by a mesh core power bus, and each line of ground bumps is interconnected by a mesh core ground bus. The busses are shorted across the bumps without having to use metal tab extensions. This arrangement provides that: signal routing can be provided between the lines of bumps; and/or the mesh core power busses can be provided as being wider in order to provide improved power mesh performance and/or in order to reduce or eliminate the metal required on the second top-most metal layer.

20 Claims, 2 Drawing Sheets

FLIPCHIP BUMP PATTERNS FOR EFFICIENT I-MESH POWER DISTRIBUTION SCHEMES

BACKGROUND

The present invention generally relates to flipchip bump patterns, and more specifically relates to a flipchip bump pattern where power and ground bumps are disposed in striped configuration.

Flipchip packaging provides that the active area of a chip is flipped over in the package, facing downward. Instead of facing up and being bonded to package leads with wires from outside edges of the chip, flipchip packaging provides that any surface area of the flip chip can be used for interconnection, which is typically effected using metal bumps of solder, copper or nickel/gold. These "bumps" or "balls" are soldered to the package substrate or the circuit board itself and underfilled with epoxy. Flipchip packaging allows for a large number of interconnects with shorter distances than wire, which greatly reduces inductance.

Traditional flipchip configurations require a dedicated silicon layer to create flipchip core power and ground bumps as well as bussing (for both the power and the ground). As a result, this layer cannot be used for core signal routing.

FIG. 1 illustrates a typical prior art flipchip die section or layer 10 (i.e., the top-most metal layer). Reference numerals 12 indicate core power bumps (i.e, each circle with a "+" therein is a core power bump), while reference numerals 14 indicate core ground bumps (i.e, each circle with a "−" therein is a core ground bump). As shown, the flipchip core power bumps 12 and the ground bumps 14 are arranged in an alternating fashion (i.e., power bump 12, ground bump 14, power bump 12, ground bump 14, etc.). Power mesh bussing 16 is also built on this layer, and is placed between the bumps 12, 14.

FIG. 2 provides an enlarged view of a portion of the section 10 shown in FIG. 1. As shown, mesh trunks 16 are strapped to the appropriate core power bumps 12 or ground bumps 14 in an alternating fashion. Reference numeral 18 identifies mesh core power busses, while reference numeral 20 identifies mesh core ground busses. Metal extension tabs 22 are used to connect the bumps 12, 14 to the appropriate busses 18, 20—i.e., power bumps 12 are connected to a power bus 18, and ground bumps 14 are connected to a ground bus 20.

Reference numerals 24 in both FIGS. 1 and 2 identify metal bussing which is provided on one or more other layers, such as the next or second top-most metal layer. This bussing 24 is conductively connected to the power busses 18 and ground busses 20 on the top-most metal layer 10 to provide a uniform current distribution across the die. It should be noted that the orientation of the top-most and second top-most metal layers (i.e., the busses 18, 20, 24) can be rotated ninety degrees depending on the application and the preferred routing directions.

While the scheme illustrated in FIGS. 1 and 2 and described hereinabove enables a power distribution method across the die, the scheme presents some disadvantages.

First, the scheme provides that the top-most metal layer is fully utilized, thereby reducing signal routing resources. Specifically, due to the bump arrangement (i.e., power bump 12, ground bump 14, power bump 12, ground bump 14, etc. in alternating fashion), power mesh layers 16 (18 and 20) must be placed between bumps and this prevents any horizontal or vertical signal routing to be placed on this top-most metal layer. Since this top-most metal layer is fully utilized for flipchip power distribution, additional metal layers are required to route the design.

Second, the metal extension tabs 22 which are required to connect the bumps 12, 14 to the busses 18, 20 result in voltage drops as well as electromigration considerations. Specifically, a finite voltage drop occurs across the metal extension tabs 22. This contributes to an overall IR drop across the chip which must be compensated for by adding more metal or reducing chip power. Furthermore, the metal extension tabs 22 must be sufficiently wide to carry suitable current. This contributes to an increase in the metal density of this top-most metal layer which has a finite manufacturing limit. Hence, metal must be removed from other sections of the power mesh to meet design rule specifications.

Third, the bump arrangement (i.e., power bump 12, ground bump 14, power bump 12, ground bump 14, etc. in alternating fashion) compromises package plane electrical performance. Specifically, core power bumps 12 and ground bumps 14 must be connected within the package to appropriate power and ground planes, and the alternating configuration of the bumps necessitates creating via holes in the package power planes to escape these bumps. This reduces the electrical performance of the package power and ground planes, mostly as a consequence of increased inductance.

OBJECT AND SUMMARY

An object of an embodiment of the present invention is to provide a flipchip configuration where power and ground bumps are disposed in a configuration which provides for a more efficient power distribution scheme.

Briefly, a specific embodiment of the present invention provides a flipchip scheme where power and ground bumps are arranged in a striped configuration. Specifically, there are a plurality of lines of power bumps, and a plurality of lines of ground bumps. Each line of power bumps is interconnected by a mesh core power bus, and each line of ground bumps is interconnected by a mesh core ground bus. The busses are shorted across the bumps without having to use metal tab extensions. This arrangement provides that:

signal routing can be provided between the lines of bumps; and/or the mesh core power busses can be provided as being wider in order to provide improved power mesh performance and/or in order to reduce or eliminate the metal required on the second top-most metal layer.

BRIEF DESCRIPTION OF THE DRAWINGS

The organization and manner of the structure and operation of the invention, together with further objects and advantages thereof, may best be understood by reference to the following description, taken in connection with the accompanying drawings, wherein.

DESCRIPTION

Figure 1:
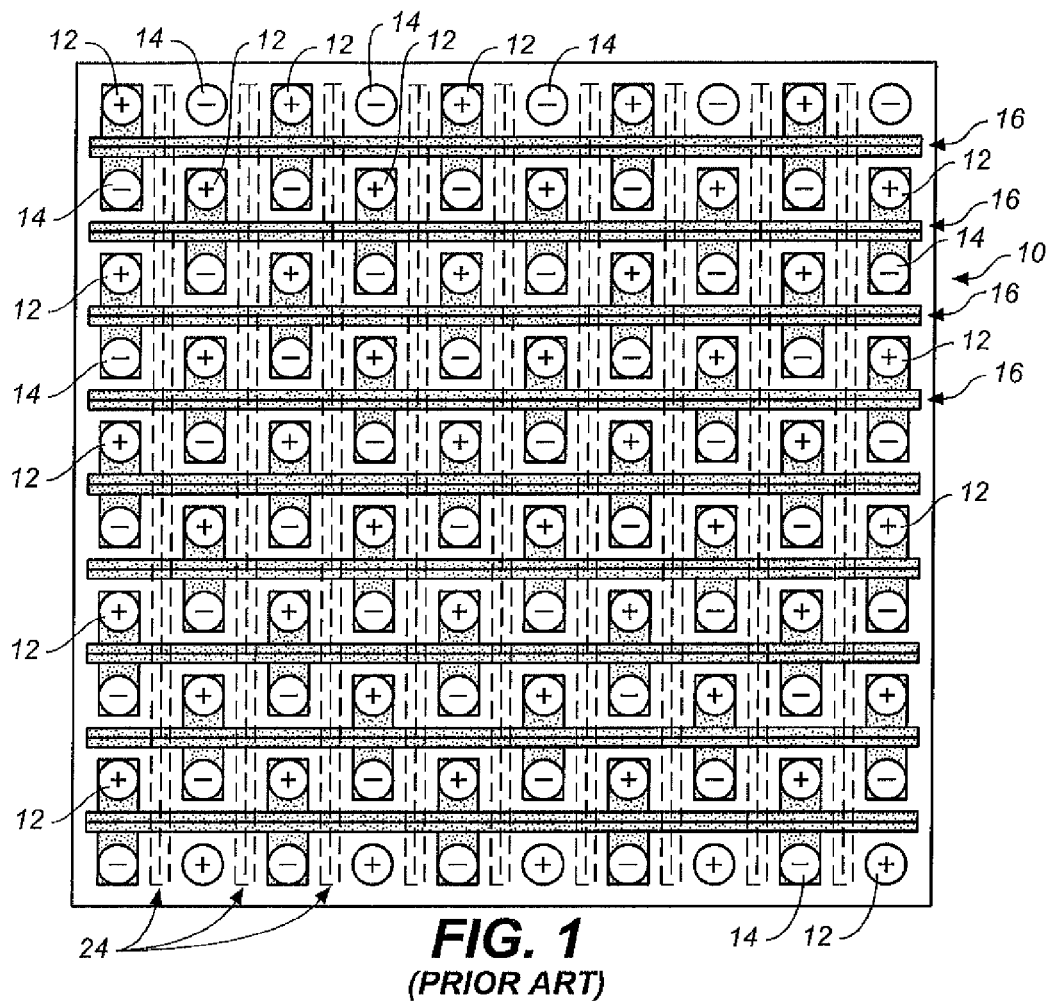
FIG. 1 illustrates a flipchip die section which is in accordance with a prior art scheme.

While the invention may be susceptible to embodiment in different forms, there is shown in the drawings, and herein will be described in detail, a specific embodiment of the present invention. The present disclosure is to be considered an example of the principles of the invention, and is not intended to limit the invention to that which is illustrated and described herein.

Figure 3:
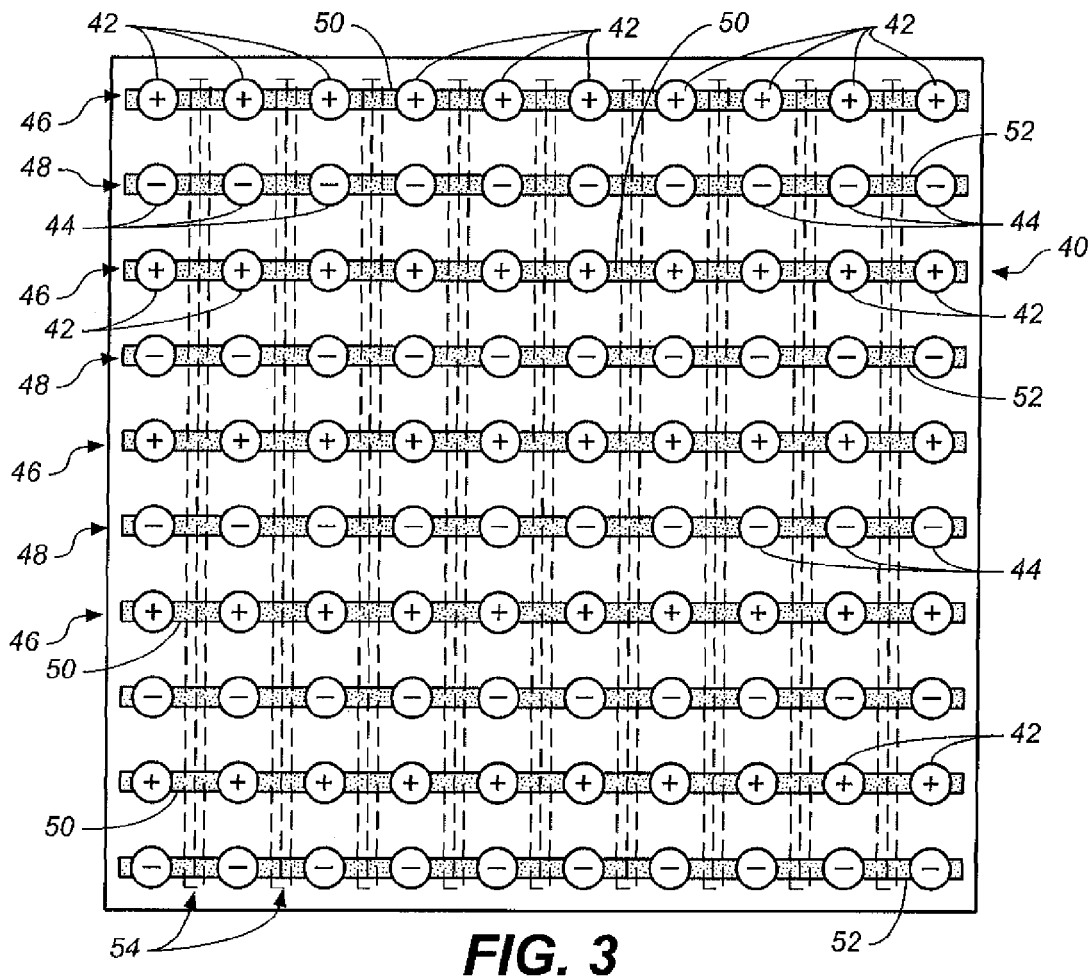
FIG. 3 illustrates a flipchip die section which is in accordance with a specific embodiment of the present invention.
Figure 4:
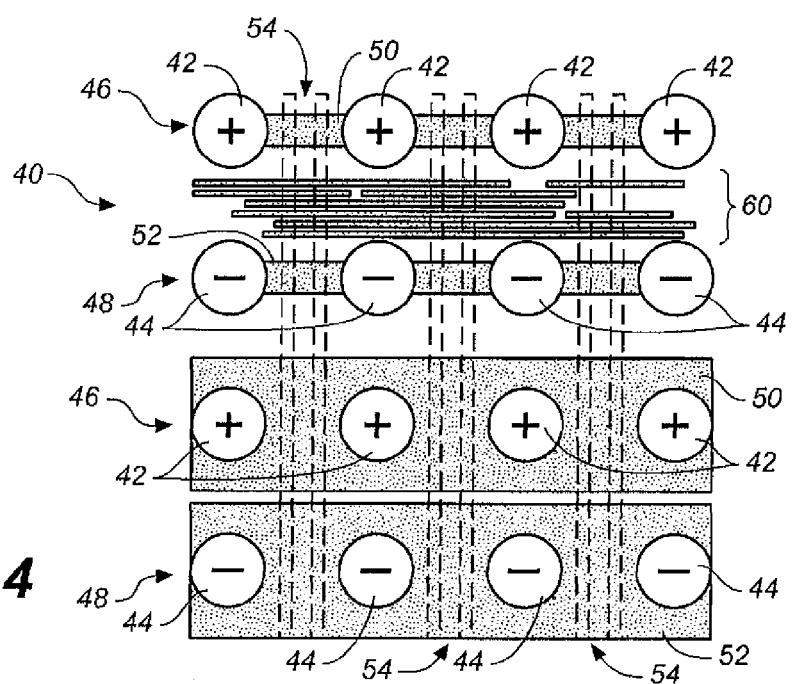
FIG. 4 provides an enlarged view of a portion of the section which is shown in FIG. 3.

FIG. 3 illustrates a flipchip die section 40 (i.e., the top-most metal layer) which is in accordance with a specific embodiment of the present invention (FIG. 4 provides an enlarged view of a portion of the section 40 shown in FIG. 3).

Reference numerals 42 indicate core power bumps (i.e, each circle with a "+" therein is a core power bump), while reference numerals 44 indicate core ground bumps (i.e, each circle with a "−" therein is a core ground bump). As shown, the flipchip core power bumps 42 and the ground bumps 44 are arranged in a striped configuration. More specifically, the die section 40 is configured such that there are a plurality of lines 46 of power bumps 42, and a plurality of lines 48 of ground bumps 44, and the core power bumps 42 are arranged in different lines than the core ground bumps 44. Preferably, the lines 46, 48 are arranged in alternating fashion in the die section 40, whereby there is a line 46 of power bumps 42, a line 48 of ground bumps 44, a line 46 of power bumps 42, a line 48 of ground bumps 44, etc. As shown in FIGS. 3 and 4, preferably each line 46 of power bumps 42 is comprised of only power bumps 42 and contains no ground bumps 44, and each line 48 of ground bumps 44 is comprised of only ground bumps 44 and contains no power bumps 42.

Instead of having to use metal extension tabs, the bump configuration shown in FIGS. 3 and 4 allows each line 46 of power bumps 42 to be interconnected by a mesh core power bus 50 which is shorted across the line 46 of power bumps 42, and allows each line 48 of ground bumps 44 to be interconnected by a mesh core ground bus 52 which is shorted across the line 48 of ground bumps 44.

Figure 2:
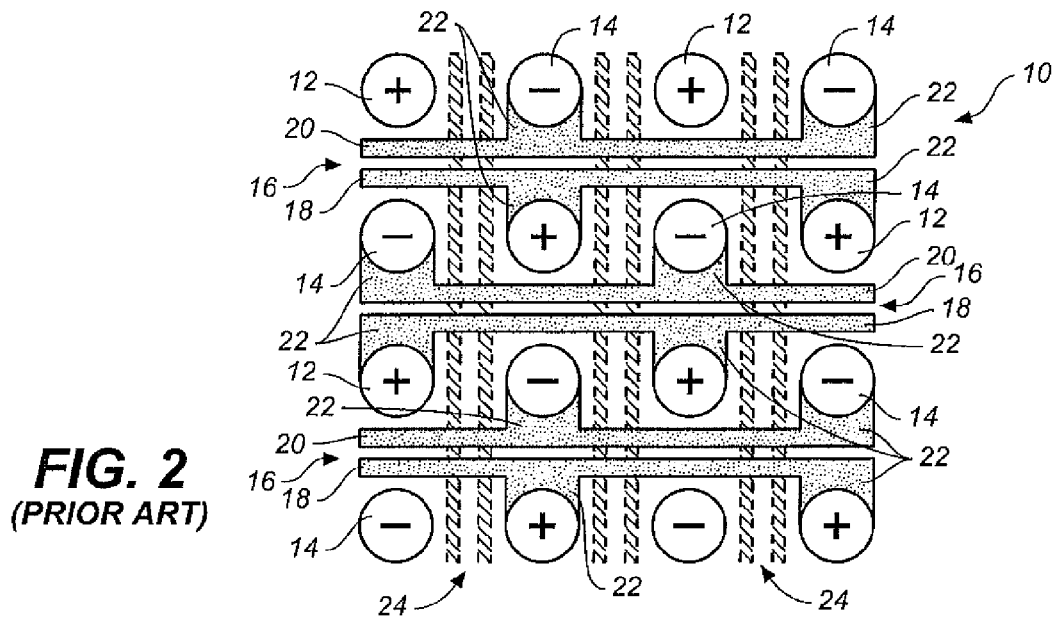
FIG. 2 provides an enlarged view of a portion of the section which is shown in FIG. 1.

As shown in the top portion of FIG. 4, the arrangement allows signal routing 60 to be placed between the lines 46, 48 of bumps. Alternatively, or additionally, each of the mesh core power busses 50 and ground busses 52 can be provided as being widened—i.e., wider than what is shown in FIG. 2. Specifically, as shown in the bottom portion of FIG. 4, each of the mesh core power busses 50 can be provided as being wider than the power bumps 42 which are connected to the mesh core power bus 50, and/or each of the mesh core ground busses 52 can be provided as being wider than the ground bumps 44 which are connected to the mesh core ground bus 52. The widened busses provide increased power mesh performance and/or reduces or eliminates the metal which is required on the second-most layer.

Reference numerals 54 in both FIGS. 3 and 4 identify metal bussing which is provided on one or more other layers, such as the next or second top-most metal layer. This bussing 54 is conductively connected to the power busses 50 and ground busses 52 on the top-most metal layer 40 to provide a uniform current distribution across the die.

There are many advantages to the scheme shown in FIGS. 3 and 4. For example, signal routing is possible on all metal layers including the top-most layer (identified with reference numeral 60 in FIG. 4). Hence, the die area and/or metal stack reduction is possible. This reduces die cost.

Additionally, by eliminating the need for metal extension tabs to connect the bumps 42, 44 to the busses 50, 52, the scheme shown in FIGS. 3 and 4 improves power mesh performance (DC IR drop, EM limits, and AC voltage drop).

Furthermore, the scheme provides the flexibility to further optimize power mesh performance, such as by utilizing space of the top-most metal layer to widen the original power mesh busses. This can be used either to improve power distribution, or to reduce the amount of metal required in lower layers to free routing resources.

Still further, the fact that the core power bumps and ground bumps are provided as being inline provides that fewer holes need be created in the package power planes. Hence, the plane has improved electrical performance. The fact that the core power bumps and ground bumps are provided as being inline provides that bumps may be tied together with common vias in the package substrate. This frees package escape resources potentially enabling higher package routing density.

Alternative configurations are possible. For example, the configuration described can be rotated ninety degrees according to preferred directions. Additionally, the top-most metal layer power mesh configurations may be pushed down to lower layers, and the top-most layer used for alternate purposes.

As such, while an embodiment of the present invention is shown and described, it is envisioned that those skilled in the art may devise various modifications of the present invention without departing from the spirit and scope of the appended claims.

What is claimed is:

1. A portion of a flipchip scheme, said portion comprising: a metal layer which comprises power bumps and ground bumps arranged in a striped configuration, wherein there are a plurality of lines of power bumps, and a plurality of lines of ground bumps, wherein each line of power bumps is interconnected by a mesh core power bus on the metal layer which is shorted across the line of power bumps, and wherein each line of ground bumps is interconnected by a mesh core ground bus on the metal layer which is shorted across the line of ground bumps, wherein each of the mesh core power busses on the metal layer is wider than the power bumps which are connected to the mesh core power bus on the metal layer.

2. A portion as recited in claim 1, further comprising signal routing on the metal layer between a line of power bumps and a line of ground bumps.

3. A portion as recited in claim 1, wherein each of the mesh core ground busses on the metal layer is wider than the ground bumps which are connected to the mesh core ground bus on the metal layer.

4. A portion of a flipchip scheme, said portion comprising: a metal layer which comprises a plurality of lines of power bumps and a plurality of lines of ground bumps, wherein each line of power bumps has no ground bumps in the line and is interconnected by a mesh core power bus on the metal layer which is shorted across the line of power bumps, and wherein each line of ground bumps has no power bumps in the line and is interconnected by a mesh core ground bus on the metal layer which is shorted across the line of ground bumps, wherein each of the mesh core power busses on the metal layer is wider than the power bumps which are connected to the mesh core power bus on the metal layer.

5. A portion as recited in claim 4, further comprising signal routing on the metal layer between a line of power bumps and a line of ground bumps.

6. A portion as recited in claim 4, wherein each of the mesh core ground busses on the metal layer is wider than the ground bumps which are connected to the mesh core ground bus on the metal layer.

7. A portion of a flipchip scheme, said portion comprising: a metal layer which comprises power bumps in a first line; ground bumps in a second line; a mesh core power bus on the metal layer which is shorted across all the bumps in the first line; and a mesh core ground bus on the metal layer which is shorted across all the bumps in the second line, wherein the mesh core power bus on the metal layer is wider than the power bumps which are connected to the mesh core power bus on the metal layer.

8. A portion as recited in claim 7, further comprising signal routing on the metal layer.

9. A portion as recited in claim 7, further comprising signal routing on the metal layer disposed between the first line and the second line.

10. A portion as recited in claim 7, wherein the mesh core ground bus on the metal layer is wider than the ground bumps which are connected to the mesh core ground bus on the metal layer.

11. A portion as claimed in claim 1, wherein at least one mesh core power bus is connected to bussing on one or more other layers, and at least one mesh core ground bus is connected to bussing on the one or more other layers.

12. A portion as claimed in claim 4, wherein at least one mesh core power bus is connected to bussing on one or more other layers, and at least one mesh core ground bus is connected to bussing on the one or more other layers.

13. A portion as claimed in claim 7, wherein at least one mesh core power bus is connected to bussing on one or more other layers, and at least one mesh core ground bus is connected to bussing on the one or more other layers.

14. A portion of a flipchip scheme, said portion comprising: a metal layer which comprises power bumps and ground bumps arranged in a striped configuration, wherein there are a plurality of lines of power bumps, and a plurality of lines of ground bumps, wherein each line of power bumps is interconnected by a mesh core power bus on the metal layer which is shorted across the line of power bumps, and wherein each line of ground bumps is interconnected by a mesh core ground bus on the metal layer which is shorted across the line of ground bumps, wherein each of the mesh core ground busses on the metal layer is wider than the ground bumps which are connected to the mesh core ground bus on the metal layer.

15. A portion as recited in claim 14, further comprising signal routing on the metal layer between a line of power bumps and a line of ground bumps.

16. A portion of a flipchip scheme, said portion comprising: a metal layer which comprises a plurality of lines of power bumps and a plurality of lines of ground bumps, wherein each line of power bumps has no ground bumps in the line and is interconnected by a mesh core power bus on the metal layer which is shorted across the line of power bumps, and wherein each line of ground bumps has no power bumps in the line and is interconnected by a mesh core ground bus on the metal layer which is shorted across the line of ground bumps, wherein each of the mesh core ground busses on the metal layer is wider than the ground bumps which are connected to the mesh core ground bus on the metal layer.

17. A portion as recited in claim 16, further comprising signal routing on the metal layer between a line of power bumps and a line of ground bumps.

18. A portion of a flipchip scheme, said portion comprising: a metal layer which comprises power bumps in a first line; ground bumps in a second line; a mesh core power bus on the metal layer which is shorted across all the bumps in the first line; and a mesh core ground bus on the metal layer which is shorted across all the bumps in the second line, wherein the mesh core ground bus on the metal layer is wider than the ground bumps which are connected to the mesh core ground bus on the metal layer.

19. A portion as recited in claim 18, further comprising signal routing on the metal layer.

20. A portion as recited in claim 18, further comprising signal routing on the metal layer disposed between the first line and the second line.

* * * * *